(12) United States Patent
Nakamura et al.

(10) Patent No.: US 10,298,220 B2
(45) Date of Patent: May 21, 2019

(54) SWITCHING ELEMENT DRIVE CIRCUIT

(71) Applicant: AISIN AW CO., LTD., Anjo-shi, Aichi-ken (JP)

(72) Inventors: Yasushi Nakamura, Nishio (JP); Yuji Takakura, Anjo (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 15/539,905

(22) PCT Filed: Dec. 10, 2015

(86) PCT No.: PCT/JP2015/084606
§ 371 (c)(1),
(2) Date: Jun. 26, 2017

(87) PCT Pub. No.: WO2016/132630
PCT Pub. Date: Aug. 25, 2016

(65) Prior Publication Data
US 2017/0373677 A1 Dec. 28, 2017

(30) Foreign Application Priority Data

Feb. 16, 2015 (JP) ................................. 2015-027374

(51) Int. Cl.
*H03K 17/687* (2006.01)
*H03K 17/0412* (2006.01)
*H02M 1/08* (2006.01)
*H03K 17/16* (2006.01)

(52) U.S. Cl.
CPC ........ *H03K 17/04123* (2013.01); *H02M 1/08* (2013.01); *H03K 17/04126* (2013.01); *H03K 17/163* (2013.01); *H03K 17/687* (2013.01)

(58) Field of Classification Search
CPC .......... H03K 17/04123; H03K 17/163; H03K 17/687; H03K 17/04126; H02M 1/08
USPC ......................................................... 327/427
See application file for complete search history.

(56) References Cited

U.S. PATENT DOCUMENTS 7,285,876 B1 * 10/2007 Jacobson ............... H02M 1/088
307/127
2012/0176176 A1 * 7/2012 Swamy ............ H03K 17/04123
327/399

FOREIGN PATENT DOCUMENTS

JP     H03-60360 A    3/1991
JP     H10-337000 A   12/1998

OTHER PUBLICATIONS

Jan. 19, 2016 Search Report issued in International Patent Application No. PCT/JP2015/084606.

* cited by examiner

*Primary Examiner* — Metasebia T Retebo
(74) *Attorney, Agent, or Firm* — Oliff PLC

(57) ABSTRACT

A switching element drive circuit that drives a main switching element by providing a control terminal of the main switching element with a drive signal that has asymmetric positive and negative potentials with respect to a reference potential, the main switching element including a ground terminal, which is a source terminal or an emitter terminal, and to which the reference potential is connected.

5 Claims, 7 Drawing Sheets

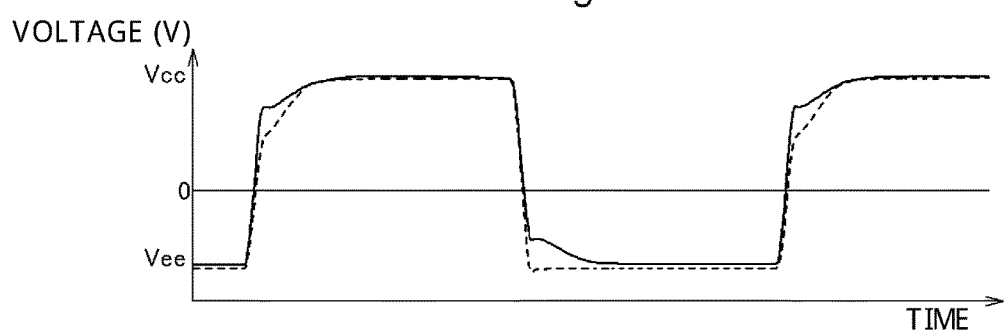
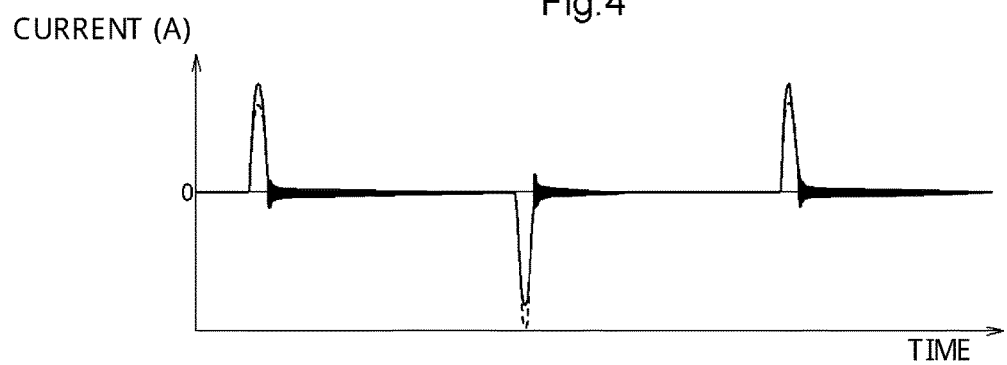

SWITCHING ELEMENT DRIVE CIRCUIT

BACKGROUND

The present disclosure relates to a switching element drive circuit that provides a control terminal of a switching element with a drive signal to drive the switching element.

A switching element such as an FET (Field Effect Transistor) and an IGBT (Insulated Gate Bipolar Transistor), for example, operates when a drive signal is provided so as to generate a potential difference between a gate terminal (control terminal) and a source terminal. A parasitic capacitance is present between the gate terminal and the source terminal of the switching element, and a power loss is caused when the parasitic capacitance is charged. The power loss is proportional to the switching frequency. Therefore, as the switching frequency becomes higher, the power loss for the drive circuit which drives the switching element becomes larger, which may cause a detriment such as an increase in size of the circuit or a power source for the drive circuit.

Japanese Patent Application Publication No. 3-60360 discloses a gate drive circuit that includes a parallel resonance circuit in order to suppress an influence of a parasitic capacitance. The gate drive circuit includes an inductor that constitutes a parallel resonance circuit with the parasitic capacitance, and includes a rectification circuit that determines the direction in which a current is applied such that a charge flows back and forth between the inductor and the parasitic capacitance. The rectification circuit includes a switch (switching element) that controls application and blockage of the current (for the above, see FIG. 1 etc. of Japanese Patent Application Publication No. 3-60360). A similar configuration is also described in United States Patent Application Publication No. 2012/0176176 A1. In such gate drive circuits, basically, energy is exchanged between the parasitic capacitance and the inductor to relieve the power loss.

The drive signal according to Japanese Patent Application Publication No. 3-60360 is a positive and negative bipolar signal that has symmetric positive and negative potentials with respect to a reference potential. In some elements such as a MOSFET that uses silicon carbide (SiC), however, the voltage resistance to a negative potential with respect to a reference potential is lower than the voltage resistance to a positive potential. Therefore, in the case where a SiC-MOSFET is driven using such a positive and negative bipolar drive signal, a positive and negative bipolar signal that has asymmetric positive and negative potentials with respect to a reference potential may be required. Since the drive signal according to Japanese Patent Application Publication No. 3-60360 is a positive and negative bipolar signal that has symmetric positive and negative potentials with respect to the reference potential, a current that flows back and forth between the parasitic capacitance and the inductor is substantially uniform (see FIG. 3 of Japanese Patent Application Publication No. 3-60360, for example). In addition, the power and the current consumed by a positive power source and a negative power source that constitute a power source for drive pulses are also substantially the same.

In the case where the drive signal is a positive and negative bipolar signal that has asymmetric positive and negative potentials with respect to the reference potential, on the other hand, the current which flows back and forth between the parasitic capacitance and the inductor is also non-uniform. In the case where the power source for drive pulses is a positive and negative bipolar power source, in addition, the power and the current consumed by the positive power source and the negative power source are also non-uniform. Therefore, while a certain effect in relieving the power loss may be obtained, a load on a drive circuit that drives the switching element or a power source that supplies power to the drive circuit may be increased. In addition, it may be necessary to use a component with a high proof stress that matches the magnitude of the consumption current, or the procurement cost may be increased because of use of components with different specifications between the positive side and the negative side. Furthermore, an unintentional undershoot or the like may be generated in the waveform of the drive signal for the switching element, and may exceed the voltage resistance of the gate terminal (control terminal) of the switching element to be driven.

SUMMARY

An exemplary aspect of the present disclosure provides a technology configured to relieve a power loss for a drive circuit that drives a switching element using a positive and negative bipolar signal that has asymmetric positive and negative potentials with respect to a reference potential as a drive signal, and to reduce a deviation in load balance in the drive circuit.

In view of the foregoing, a switching element drive circuit according to an exemplary aspect is a switching element drive circuit that drives a main switching element by providing a control terminal of the main switching element with a drive signal that has asymmetric positive and negative potentials with respect to a reference potential, the main switching element including a ground terminal, which is a source terminal or an emitter terminal, and to which the reference potential is connected, the switching element drive circuit includes: a power source circuit that is a positive and negative bipolar power source and includes a positive power source that provides a positive potential which is positive with respect to the reference potential and a negative power source that provides a negative potential which is negative with respect to the reference potential and whose absolute value is different from an absolute value of the positive potential, the positive and negative potentials being asymmetric with respect to the reference potential; an inductor, one terminal of which is connected to a control terminal side and the other terminal of which is connected to a reference potential side; a first current path in which a first rectification element, a forward direction of which is a direction from the control terminal side to the reference potential side, and a first switch are connected in series with each other; and a second current path in which a second rectification element, a forward direction of which is a direction from the reference potential side to the control terminal side, and a second switch are connected in series with each other, wherein: a resonance control circuit is formed by connecting a rectification circuit, in which the first current path and the second current path are connected in parallel with each other, and the inductor in series with each other; the resonance control circuit is connected between the control terminal and the reference potential such that a parasitic capacitance between the control terminal and the ground terminal of the main switching element and the resonance control circuit form a resonance circuit; and the switching element drive circuit further includes a bias circuit that sets a potential of a terminal of the resonance control circuit on the opposite side from the control terminal side to a bias potential that is different from the reference potential.

The drive signal for the main switching element relieves a power loss due to the parasitic capacitance through energy exchange by the parallel resonance circuit which is constituted of the parasitic capacitance and the inductor. The parallel resonance circuit is very effective in the case where the drive signal is a positive and negative bipolar signal that is symmetric with respect to the reference potential. In the case where the drive signal is an asymmetric positive and negative bipolar signal, a DC component due to the asymmetry of the amplitude of the drive signal with respect to the reference potential affects the resonance circuit. With the configuration described above, however, the DC component can be canceled by the bias potential. As a result, it is possible to relieve a power loss for the drive circuit which drives the main switching element using a positive and negative bipolar signal that has asymmetric positive and negative potentials with respect to the reference potential as the drive signal, and to reduce a deviation in load balance in the drive circuit.

Further characteristics and advantages of the switching element drive circuit will become clear from the following description of an embodiment made with reference to the drawings.

BRIEF DESCRIPTION OF THE DRAWINGS

FIG. 3 is a waveform chart illustrating an example of the waveform of a drive signal.

FIG. 4 is a waveform chart illustrating an example of the waveform of a current that flows through a resonance coil.

DETAILED DESCRIPTION OF EMBODIMENTS

Figure 1:
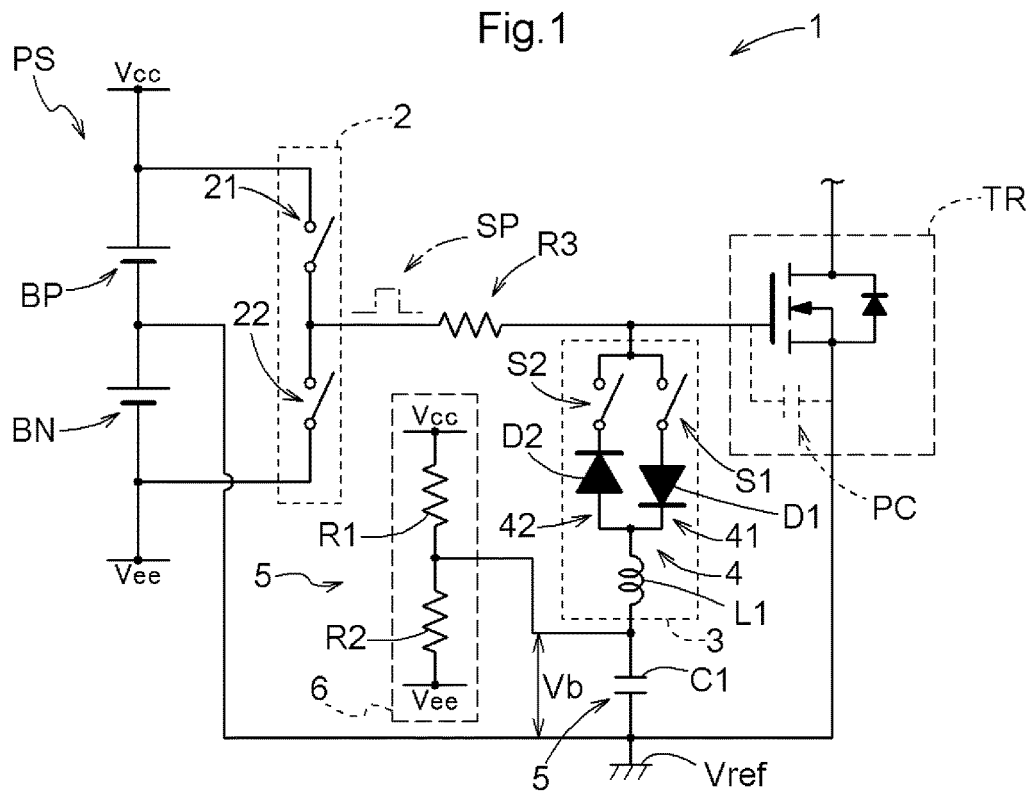
FIG. 1 is a schematic circuit block diagram illustrating the basic configuration of a gate drive circuit.
Figure 2:
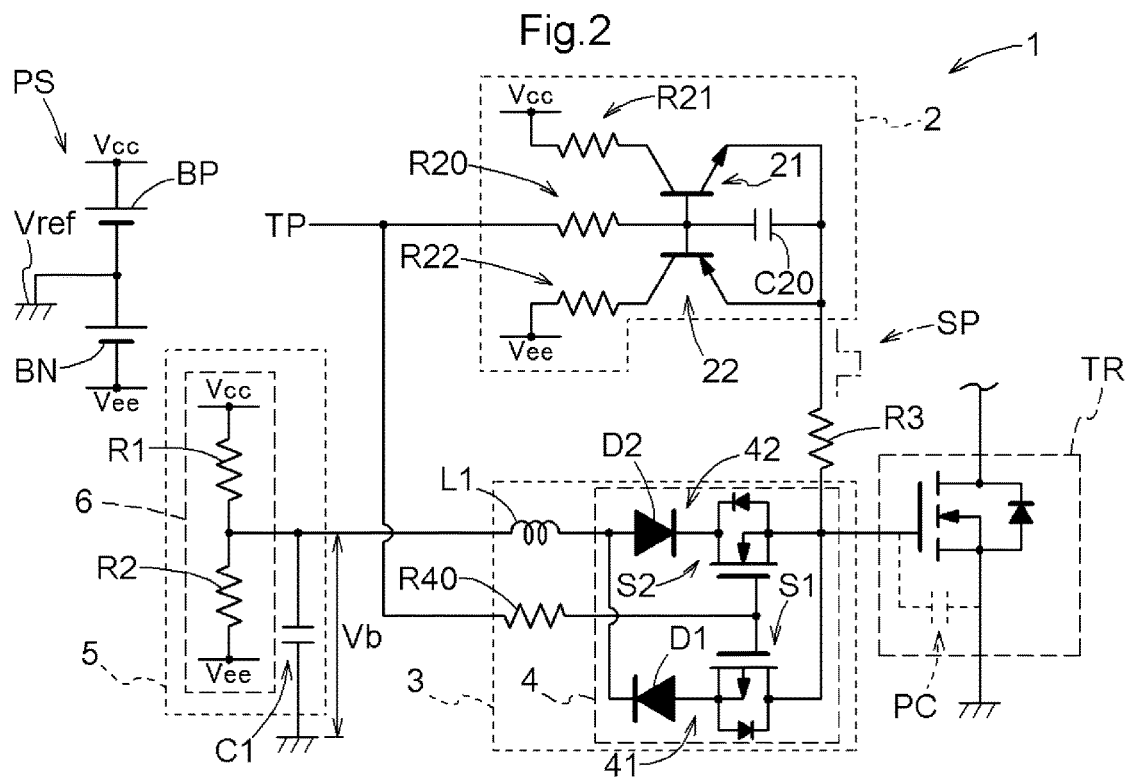
FIG. 2 is a schematic circuit diagram illustrating an example of the configuration of the gate drive circuit.
Figure 15:
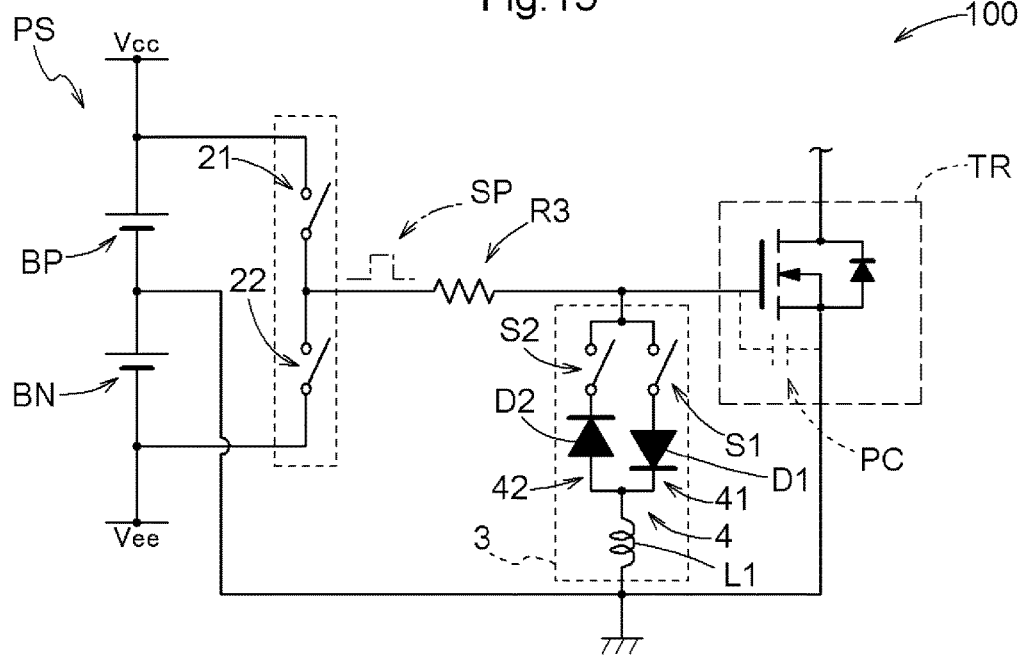
FIG. 15 is a schematic circuit block diagram illustrating a comparative example of the gate drive circuit.

A switching element drive circuit according to an embodiment of the present disclosure will be described below with reference to the drawings. FIG. 1 is a schematic circuit block diagram illustrating the basic configuration of a gate drive circuit (switching element drive circuit). FIG. 2 is a schematic circuit diagram illustrating an example of the configuration of the gate drive circuit which conforms to the basic configuration. FIG. 15 is a schematic circuit block diagram illustrating a comparative example corresponding to FIG. 1. A gate drive circuit 1 is a circuit that provides a control terminal of a main switching element TR with a drive signal SP to drive the main switching element TR.

In the embodiment, a MOS (Metal Oxide Semiconductor)-type FET is illustrated as an example of the main switching element TR, and the control terminal is a gate terminal. The main switching element TR is connected in an aspect of a source-grounded circuit having a source terminal serving as a ground terminal. In the case where the main switching element TR is an IGBT, the main switching element TR is connected in an aspect of an emitter-grounded circuit with an emitter terminal serving as a ground terminal. A reference potential Vref, which is generally referred to as a "ground", is connected to the source terminal or the emitter terminal. In the following description, the ground terminal will be referred to as simply the "source terminal". In the case where the main switching element TR is an IGBT or the like, as a matter of course, the "source terminal" in the description can be read as the "emitter terminal".

In the aspect illustrated in FIGS. 1 and 2, the drive signal SP is a bipolar signal that has potentials in both the positive and negative directions with respect to the reference potential Vref. The main switching element TR transitions from an off state to an on state when a prescribed voltage is applied between the gate and the source. Here, in the case where a threshold voltage for a state transition is close to the reference potential Vref which is connected to the source terminal, the main switching element TR may transition to the on state because of external noise or the like. In this case, if a bipolar signal is used as the drive signal SP, the main switching element TR can be stably brought into the off state by providing a potential that is lower than the reference potential Vref. For example, a MOSFET that uses silicon carbide (SiC) has a relatively low threshold voltage. Thus, such a bipolar signal is preferably used as the drive signal SP in the case where the main switching element TR is a SiC-MOSFET or the like.

The gate drive circuit 1 illustrated in FIGS. 1 and 2 includes a power source circuit PS which is a bipolar power source in order to generate the drive signal SP which is a bipolar signal. In the power source circuit PS, a positive power source BP and a negative power source BN are connected in series with each other with the connection point therebetween at the reference potential Vref. That is, the positive power source BP provides the gate drive circuit 1 with a potential (positive potential Vcc) that is positive with respect to the reference potential Vref, and the negative power source BN provides the gate drive circuit 1 with a potential (negative potential Vee) that is negative with respect to the reference potential Vref. Here, the reference potential Vref is zero, and the power source circuit PS provides the gate drive circuit 1 with a voltage of "|Vcc|+|Vee|". In the embodiment, the absolute value (|Vcc|) of the positive potential Vcc relative to the reference potential Vref and the absolute value (|Vee|) of the negative potential Vee relative to the reference potential Vref are different from each other. In the embodiment, in addition. "|Vcc|>|Vee|" is met, and the absolute value (|Vcc|) of the positive potential Vcc relative to the reference potential Vref is larger than the absolute value (|Vee|) of the negative potential Vee relative to the reference potential Vref. That is, the power source circuit PS includes a positive and negative bipolar power source with asymmetric positive and negative potentials.

As discussed above, the drive signal SP is preferably a bipolar signal in the case where the main switching element TR is a SiC-MOSFET or the like. It should be noted, however, that the voltage resistance to a negative potential is lower than the voltage resistance to a positive potential in some SiC-MOSFETs. In the embodiment, assuming SiC-MOSFETs with such properties, the drive signal SP which is a bipolar signal is generated by a positive and negative bipolar power source (power source circuit PS) in which the absolute value (|Vcc|) of the positive potential Vcc relative to the reference potential Vref is larger than the absolute value (|Vee|) of the negative potential Vee relative to the reference potential Vref.

A drive signal generation circuit 2 generates the drive signal SP which has a voltage amplitude in a range provided from the power source circuit PS on the basis of a timing signal TP from a control device (not illustrated) such as a microcomputer. The drive signal generation circuit 2 is constituted by connecting an upper switch 21, which is connected to the positive pole of the power source circuit PS, and a lower switch 22, which is connected to the negative pole of the power source circuit PS, in series with each other. When one of the upper switch 21 and the lower switch 22 is exclusively brought into the on state, the drive signal SP which has a state in which the signal level is at the positive potential Vcc and a state in which the signal level is at the negative potential Vee is generated. The drive signal SP is input to the gate terminal of the main switching element TR via a current limiting resistor R3.

FIG. 2 illustrates a specific example of the circuit configuration of the drive signal generation circuit 2. Here, the two switches (21, 22) of the drive signal generation circuit 2 are each constituted of a transistor of a bipolar type. The upper switch 21 is an NPN-type transistor, and the lower switch 22 is a PNP-type transistor. One of the NPN-type transistor and the PNP-type transistor is exclusively brought into the on state in accordance with the state of the timing signal TP (in accordance with whether the signal level of the timing signal TP is in a high state or in a low state). As discussed later, the timing signal TP is input to base terminals of the two transistors via an integration circuit, and therefore the two transistors are controlled so as not to be brought into the on state at the same time. A resistor R21 and a resistor R22 are each a resistor that prescribes a current that flows between a collector and an emitter of the transistor as a switch (21, 22).

A resistor R20 and a capacitor C20 constitute an integration circuit. An output of the integration circuit is input to the control terminals of the switches (21, 22) (the base terminals of the transistors). The capacitor C20 is charged through a path that passes through the resistor R21. Thus, a time corresponding to a time constant (r=resistance value×capacitance) determined in accordance with the resistance value of the resistor R20 and the capacitance of the capacitor C20 is taken before the potential of the capacitor C20 is brought from the reference potential Vref (=0) to the positive potential Vcc or the negative potential Vee. On the other hand, the capacitor C20 is discharged by way of a point between the base and the emitter of the transistor of one of the upper switch 21 and the lower switch 22. Thus, the time before the potential of the capacitor C20 is brought from the positive potential Vcc or the negative potential Vee to the reference potential Vref (=0) is short. Because of the effect of the integration circuit, the time when the potential of the drive signal SP is brought to the positive potential Vcc in response to a rise in timing signal TP is delayed by a time that matches the time constant r. Because of the effect of the integration circuit, in addition, the time when the potential of the drive signal SP is brought to the negative potential Vee in response to a fall in timing signal TP is also delayed by a time that matches the time constant t.

On the other hand, the time when the potential of the drive signal SP is varied from the positive potential Vcc is substantially synchronized with a fall in timing signal TP. In addition, the time when the potential of the drive signal SP is varied from the negative potential Vee is substantially synchronized with a rise in timing signal TP. As discussed above, the time when the potential of the drive signal SP is brought into the positive potential Vcc and the time when the potential of the drive signal SP is brought into the negative potential Vee in response to variations in timing signal TP are delayed by a time that matches the time constant T. Thus, the potential of the drive signal SP is brought from the positive potential Vcc into a high-impedance (Hi-Z) state substantially in synchronization with a fall in timing signal TP. Similarly, the potential of the drive signal SP is brought from the negative potential Vee into the Hi-Z state substantially in synchronization with a rise in timing signal TP. In the Hi-Z state, the gate drive circuit 1 according to the embodiment causes a resonance circuit to generate electric oscillation as described below.

A parasitic capacitance PC in the order of [nF] to [pF] is present between the gate and the source of the switching element such as an FET. An n-channel type FET such as that illustrated in FIGS. 1 and 2 is brought into the on state by applying to the gate terminal a voltage in the forward direction with respect to the source terminal. That is, the drive signal SP rises from a low-potential state to a high-potential state. In this event, energy of the drive signal SP is used to charge the parasitic capacitance PC, which causes a power loss. In addition, the rise in drive signal SP is delayed, for example, by charge of the parasitic capacitance PC. If the switching frequency for switching on and off the main switching element TR becomes higher, the power loss due to the parasitic capacitance PC is not ignorable.

In order to suppress an influence of the parasitic capacitance PC, the gate drive circuit 1 includes a resonance coil L1 (inductor) in order to constitute a parallel resonance circuit with the parasitic capacitance PC. One terminal of the resonance coil L1 is connected to the gate terminal (control terminal) side, and the other terminal of the resonance coil L1 is connected to the reference potential Vref side. The parallel resonance circuit is constituted by connecting a resonance control circuit 3 that includes the resonance coil L1 and the parasitic capacitance PC in parallel with each other. The resonance control circuit 3 is constituted by connecting a rectification circuit 4 and the resonance coil L1 in series with each other.

The rectification circuit 4 is constituted by connecting a first current path 41 and a second current path 42, which allow passage of currents in directions opposite to each other, in parallel with each other. The first current path 41 is constituted by connecting a first rectification circuit D1, the forward direction of which is the direction from the gate terminal (control terminal) side to the reference potential Vref side, and a first switch S1 in series with each other. That is, the first current path 41 is a current path that allows movement of energy from the parasitic capacitance PC to the resonance coil L1. The second current path 42 is constituted by connecting a second rectification circuit D2, the forward direction of which is the direction from the reference potential Vref side to the gate terminal (control terminal) side, and a second switch S2 in series with each other. That is, the second current path 42 is a current path that allows movement of energy from the resonance coil L1 to the parasitic capacitance PC.

In the first current path 41 and the second current path 42, the switches (S1, S2) which are connected in series with the rectification elements (D1, D2) are constituted of FETs in the embodiment. The timing signal TP is input via a current limiting resistor to the gate terminals of the FETs which constitute the first switch S1 and the second switch S2. The first switch S1 is a p-channel type FET, and the second switch S2 is an n-channel type FET. One of the p-channel type FET and the n-channel type FET is exclusively brought into the on state in accordance with the state of the timing signal TP (in accordance with whether in the high state or in the low state).

When the timing signal TP rises from the low state to the high state, the n-channel type FET which constitutes the second switch S2 is brought into the on state so that the second current path 42 allows passage of a current. The second current path 42 is a current path that allows movement of energy from the resonance coil L1 to the parasitic capacitance PC. Thus, the parasitic capacitance PC is charged by the energy of the resonance coil L1 to raise the potential of the gate terminal of the main switching element TR. After the timing signal TP rises, the drive signal SP is in the Hi-Z state until a time corresponding to the time constant τ discussed above elapses. Thus, the main switching element TR is driven by the energy of the resonance coil L1 after the timing signal TP rises and until the time corresponding to the time constant τ elapses. After the time corresponding to the time constant τ elapses, power is supplied from the power source circuit PS (in this case, the positive power source BP) via the drive signal generation circuit 2 to drive the main switching element IR.

When the timing signal TP falls from the high state to the low state, the p-channel type FET which constitutes the first switch S1 is brought into the on state so that the first current path 41 allows passage of a current. The first current path 41 is a current path that allows movement of energy from the parasitic capacitance PC to the resonance coil L1. Thus, the energy charged in the parasitic capacitance PC is moved to the resonance coil L1. After the timing signal TP falls, the drive signal SP is in the Hi-Z state until a time corresponding to the time constant t discussed above elapses. Thus, the potential of the gate terminal of the main switching element TR is reduced by the movement of the energy to the resonance coil L1 after the timing signal TP falls and until the time corresponding to the time constant t elapses. After the time corresponding to the time constant t elapses, the gate terminal is connected to the power source circuit PS (in this case, the negative power source BN) via the drive signal generation circuit 2, and the potential of the gate terminal is reduced to bring the main switching element TR into the off state.

In the embodiment, the gate drive circuit 1 is configured to further include a bias circuit 5. The bias circuit 5 sets a potential of a terminal of the resonance control circuit 3 on the opposite side from the gate terminal side to a bias potential Vb that is different from the potential of the source terminal of the main switching element TR. In the embodiment, as discussed above, "|Vcc|>|Vee|" is met, and the bias potential Vb is a potential in the positive direction with respect to the potential (reference potential Vref) of the source terminal of the main switching element TR. In the case where the power source circuit PS, which is a positive and negative bipolar power source, is an asymmetric power source with different positive and negative absolute values, the effect of the resonance circuit can be enhanced by setting an appropriate bias potential Vb in this way.

A circuit block in FIG. 15 indicates a circuit 100 according to a comparative example corresponding to FIG. 1 which illustrates the circuit block according to the embodiment. The circuit 100 according to the comparative example is an aspect obtained by removing the bias circuit 5 from the gate drive circuit 1 illustrated in FIG. 1 and connecting the resonance control circuit 3 to the reference potential Vref. Such a circuit configuration of the circuit 100 according to the comparative example can be easily reasoned by analogy from FIG. 2, and thus is not illustrated. Differences between the gate drive circuit 1 according to the embodiment and the circuit 100 according to the comparative example, that is, differences due to the presence and absence of the bias circuit 5, will be described below with reference to FIGS. 3 to 7.

Figure 5:
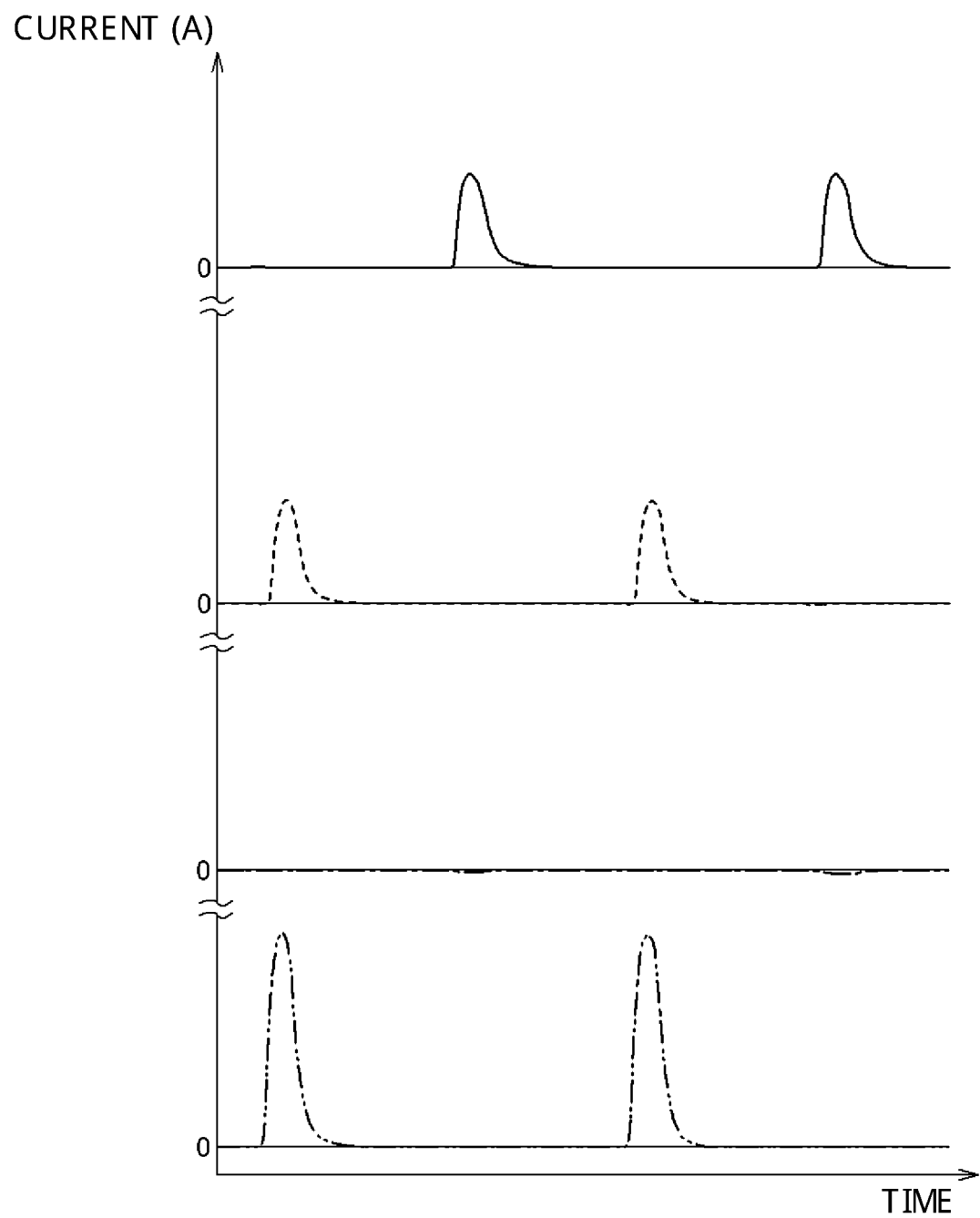
FIG. 5 is a waveform chart illustrating an example of the waveform of a current that flows through a power source.
Figure 6:
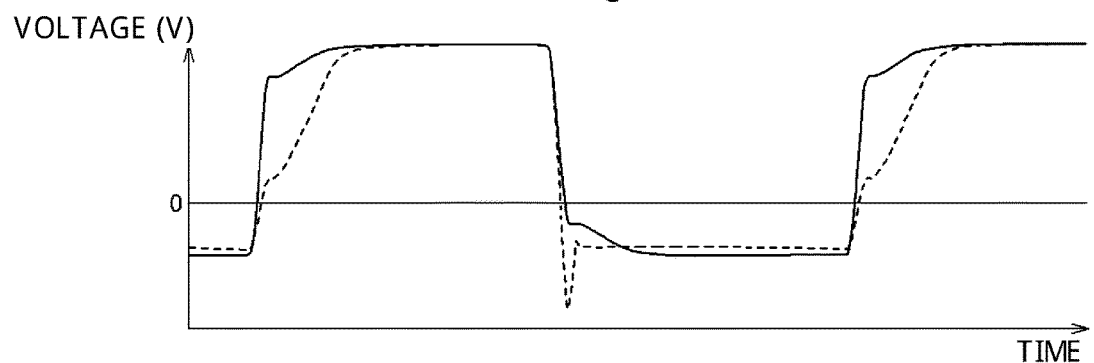
FIG. 6 is a waveform chart illustrating another example of the waveform of the drive signal.
Figure 7:
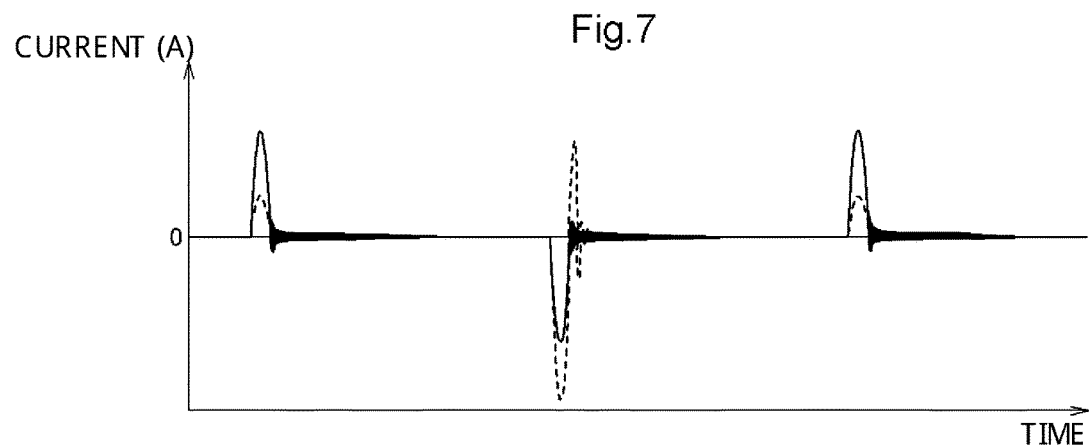
FIG. 7 is a waveform chart illustrating another example of the waveform of the current which flows through the resonance coil.

The waveform charts of FIGS. 3 to 5 indicate the simulation results for a case where the specifications of the power source circuit PS are determined as "|Vcc|:|Vee|≈3:2". Meanwhile, FIGS. 6 and 7 illustrate the simulation results for a case where the specifications of the power source circuit PS are determined as "|Vcc|:|Vee|≈2:1". The reference potential Vref is zero. FIGS. 3 and 6 illustrate the waveform of the drive signal SP. FIGS. 4 and 7 illustrate the waveform of a current that flows through the resonance coil L1. FIG. 5 illustrates the waveform of a current that flows through the power source circuit PS. In FIGS. 3 and 6, the solid line indicates the drive signal SP for the gate drive circuit 1 in the aspect illustrated in FIGS. 1 and 2, and the broken line indicates the drive signal SP for the circuit 100 according to the comparative example in the aspect illustrated in FIG. 15. In FIGS. 4 and 7, the solid line indicates the current which flows through the resonance coil L1 of the gate drive circuit 1 in the aspect illustrated in FIGS. 1 and 2, and the broken line indicates the current which flows through the resonance coil L1 of the circuit 100 according to the comparative example in the aspect illustrated in FIG. 15. FIG. 5 will be discussed later.

As illustrated in FIG. 3, at a rise in drive signal SP, in particular, a delay in drive signal SP has been resolved better and the waveform has a shape that is closer to a rectangular wave for the gate drive circuit 1 which has the bias circuit 5. Here, with reference to FIG. 4, as indicated by the broken line, the magnitudes of positive and negative currents that flow through the resonance coil L1 of the circuit 100 according to the comparative example are not uniform. That is, the current (positive current) which flows from the parasitic capacitance PC to the resonance coil L1 is larger than the current (negative current) which flows from the resonance coil L1 to the parasitic capacitance PC. Therefore, at a rise in drive signal SP, energy for charging the parasitic capacitance PC is insufficient, which causes a delay at a rise. At a fall in drive signal SP, energy of the parasitic capacitance PC is sufficiently discharged, and therefore no delay is caused. Therefore, the drive signal SP for the circuit 100 according to the comparative example has a distorted waveform with broken symmetry. Energy that is insufficient to charge the parasitic capacitance PC is supplemented with energy from the power source circuit PS.

In the gate drive circuit 1 according to the embodiment, as indicated by the solid line in FIG. 4, the magnitudes of positive and negative currents that flow through the resonance coil L1 are substantially uniform. That is, energy for charging the parasitic capacitance PC and energy discharged from the parasitic capacitance PC are substantially equal to each other. Therefore, the delay at a rise has been resolved and a delay is caused at a rise compared to the drive signal SP for the circuit 100 according to the comparative example. It should be noted, however, that the drive signal SP for the gate drive circuit 1 according to the embodiment has a waveform that is less distorted and without broken symmetry. A charge that flows back and forth between the parasitic capacitance PC and the resonance coil L1 is decreased by an impedance in the circuit. Energy that is insufficient because of such a decrease in charge is supplemented with energy from the power source circuit PS.

FIG. 5 illustrates the waveform of a current that flows through the power source circuit PS. Waveforms indicated in the upper and second charts indicate currents that flow through the power source circuit of the gate drive circuit 1 according to the embodiment. The solid line indicates a current that flows through the negative power source BN, and the broken line indicates a current that flows through the positive power source BP. Waveforms indicated in the third and lower charts indicate currents that flow through the power source circuit of the circuit 100 according to the comparative example. The dash-and-dot line in the third chart indicates a current that flows through the negative power source BN, and the double-dashed line in the third chart indicates a current that flows through the positive power source BP.

In the circuit 100 according to the comparative example, as discussed above, energy for charging the parasitic capacitance PC is insufficient at a rise in drive signal SP, and supplemented with energy from the positive power source BP. Thus, a large current flows through the positive power source BP. On the other hand, energy is not insufficient at a fall in drive signal SP, and therefore almost no current flows through the negative power source BN. In the gate drive circuit 1 according to the embodiment, as discussed above, energy for charging the parasitic capacitance PC and energy discharged from the parasitic capacitance PC are substantially equal to each other. Therefore, the currents which flow through the positive power source BP and the negative power source BN are also substantially equal to each other. In the gate drive circuit 1 according to the embodiment, in addition, the current which flows through the resonance coil L1 is not deflected in any of the positive and negative directions as in the circuit 100 according to the comparative example. Thus, the maximum amplitude of the current which flows through the positive power source BP and the negative power source BN for the gate drive circuit 1 according to the embodiment is about half that for the circuit 100 according to the comparative example.

The difference between the gate drive circuit 1 according to the embodiment and the circuit 100 according to the comparative example discussed above is more remarkable when the ratio between the voltages of the positive power source BP and the negative power source BN in the power source circuit PS becomes higher. As discussed above, FIGS. 6 and 7 illustrate the simulation results for a case where the ratio between the voltages of the positive power source BP and the negative power source BN, that is, "|Vcc|:|Vee|", is "2:1". As indicated by the broken line in FIG. 6, the drive signal SP for the circuit 100 according to the comparative example has a waveform with more broken symmetry than that in FIG. 3 and that has a large undershoot (voltage surge) and large oscillation due to the undershoot. In addition, this undershoot increases the loss of the main switching element TR. As indicated by the solid line in FIG. 6, on the other hand, the drive signal SP for the gate drive circuit 1 according to the embodiment has a waveform with good symmetry and that is close to a rectangular wave as with that in FIG. 3.

Here, with reference to FIG. 7, as indicated by the broken line, the difference between the magnitudes of positive and negative currents that flow through the resonance coil L1 of the circuit 100 according to the comparative example is larger than that in FIG. 4. Therefore, at a rise in drive signal SP, energy for charging the parasitic capacitance PC is further insufficient, which causes a significant delay at a rise. At a fall in drive signal SP, energy of the parasitic capacitance PC is discharged more than necessary, which not only prevents occurrence of a delay but also lowers the potential of the drive signal SP more than necessary to cause an undershoot. Therefore, the drive signal SP for the circuit 100 according to the comparative example has a distorted waveform with broken symmetry.

In this way, with the gate drive circuit 1 according to the embodiment, the waveform of the drive signal SP is close to a rectangular wave which has symmetry, and allows stable control of the main switching element TR.

In addition, stable electric oscillation between the resonance coil L1 and the parasitic capacitance PC can be achieved, which can relieve a burden on the power source circuit PS. In the case where the power source circuit PS is constituted using a positive and negative bipolar power source, in addition, loads on the positive power source BP and the negative power source BN can be equalized with each other. Thus, it is not necessary to enhance the specifications of any of the positive and negative power sources, which can suppress an increase in procurement cost of components. In addition, it is less likely that a burden on any of the positive and negative power sources is increased to affect the life of the one of the positive and negative power sources, which can suppress a reduction in reliability of the gate drive circuit 1.

Figure 8:
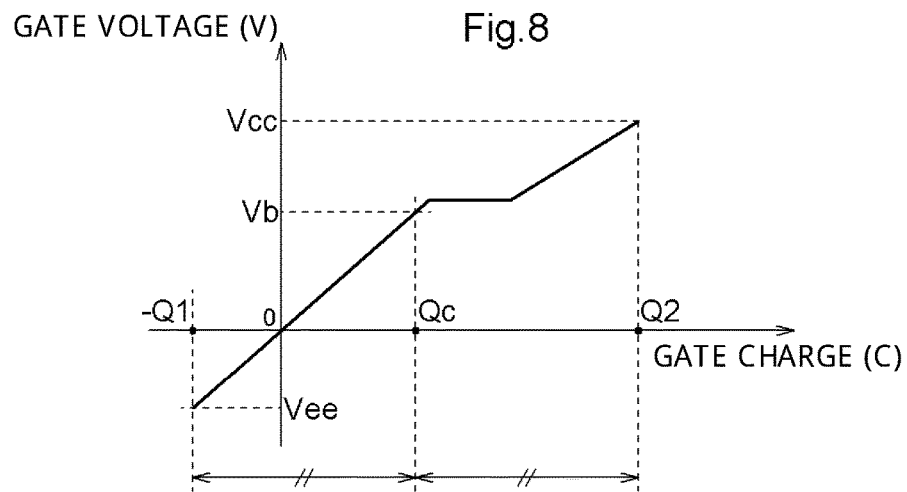
FIG. 8 illustrates the principle for setting a bias potential.

The bias potential Vb which is set by the bias circuit 5 is preferably a potential at which the charge in the parasitic capacitance PC, which is varied along with variations in potential of the gate terminal due to the drive signal SP, is balanced. FIG. 8 illustrates the bias potential Vb which is set in such a manner. In the case where the main switching element TR is to be turned on, the gate voltage of the main switching element TR transitions from Vee to Vcc as illustrated in FIG. 8. In this event, the charge in the parasitic capacitance PC transitions from "−Q1" to "Q2". In the drawing, "Qc" indicates a point at which the charge in the parasitic capacitance PC which is fluctuated between "−Q1" and "Q2" is balanced. That is, "Qc=(|−Q1|+|Q2|)/2" is met. The bias potential Vb is preferably the gate voltage at the time when the charge in the parasitic capacitance PC is "Qc". When electric oscillation is generated around the potential, the current which flows through the resonance coil L1 is balanced in both the positive and negative directions.

A voltage dividing circuit 6 illustrated in FIGS. 1 and 2 sets the bias potential Vb in accordance with voltages divided by a resistor R1 and a resistor R2. The voltage dividing circuit 6 sets an initial value of the bias potential Vb. In the voltage dividing circuit 6, the values of the resistor R1 and the resistor R2 are set such that a resistor divided potential "(R1·|Vee|+R2·Vcc)/(R1+R2)" is a potential corresponding to the midpoint "Qc" of the charge discussed above. The resistor R1 and the resistor R2 preferably have a large resistance value of roughly 100 [kΩ] or more for reason of suppressing power consumption. In the case where the bias circuit 5 includes a bias capacitor C1 as illustrated in FIGS. 1 and 2, in addition, the bias potential Vb is moved to an optimum point after the main switching element TR starts switching. In order to move the bias potential Vb to the optimum point immediately without depending on the resistor divided potential, the impedance of the voltage dividing circuit 6 is preferably high. Thus, the resistor R1 and the resistor R2 preferably have a large resistance value of roughly 100 [kΩ] or more also for this reason.

As discussed above, after the main switching element TR starts switching, the bias potential Vb is moved to the optimum point by the action of the bias capacitor C1. Thus, it is not necessary for the voltage dividing circuit 6 to set the resistor divided potential exactly in accordance with the conditions illustrated in FIG. 8. The main switching element TR is subjected to individual differences, and therefore the capacitance of the parasitic capacitance PC also differs in accordance with the main switching element TR. The inductance of the resonance coil L1 is also subjected to individual differences. Thus, the potential which is set by the voltage dividing circuit 6 may be different from the bias potential Vb, which is ideal. If the potential is set to a value that is more or less close to the bias potential Vb, the time for convergence to an optimum potential by the bias capacitor C1 can be reduced. Therefore, the potential which is set by the voltage dividing circuit 6 may be the midpoint between Vcc and Vee, for example. In any case, the bias potential Vb is set such that the ratio (|Vcc−Vb|:|Vb−Vee|) between the absolute value (|Vcc−Vb|) of the potential difference between the positive potential Vcc and the bias potential Vb and the absolute value (|Vb−Vee|) of the potential difference between the negative potential Vee and the bias potential Vb is closer to 1:1 than the ratio (|Vcc|:|Vee|) between the absolute value (|Vcc|) of the positive potential Vcc and the absolute value (|Vee|) of the negative potential Vee.

Figure 9:
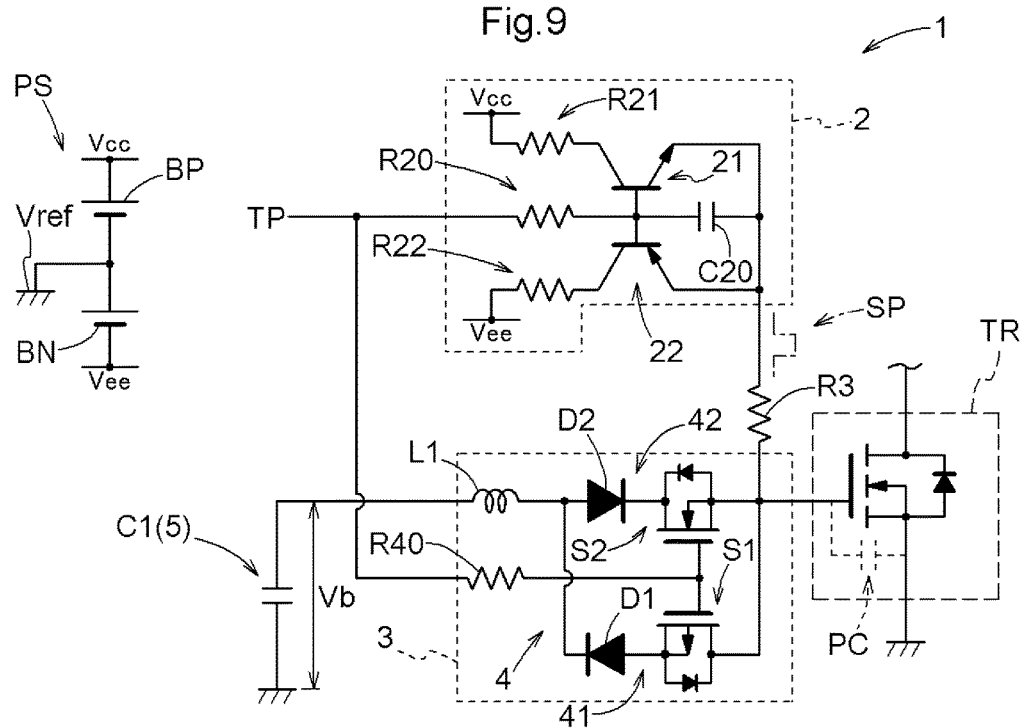
FIG. 9 is a schematic circuit diagram illustrating another example of the configuration of the gate drive circuit.

With focus on such action of the bias capacitor C1, it is clear that the gate drive circuit 1 may adopt other circuit configurations. FIG. 9 illustrates another example of the configuration of the gate drive circuit 1. In the gate drive circuit 1 illustrated in FIG. 2, the bias circuit 5 is configured to include the voltage dividing circuit 6 and the bias capacitor C1. In the gate drive circuit 1 illustrated in FIG. 9, however, the bias circuit 5 is configured to include only the bias capacitor C1.

Figure 10:
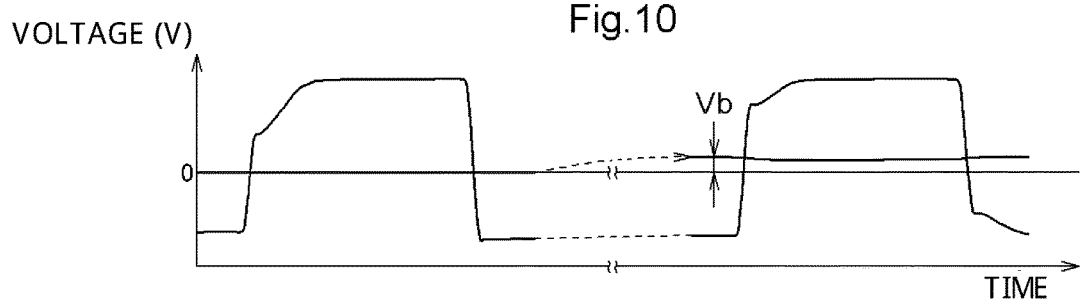
FIG. 10 is a waveform chart illustrating an example of variations in waveform of a gate drive signal.
Figure 11:
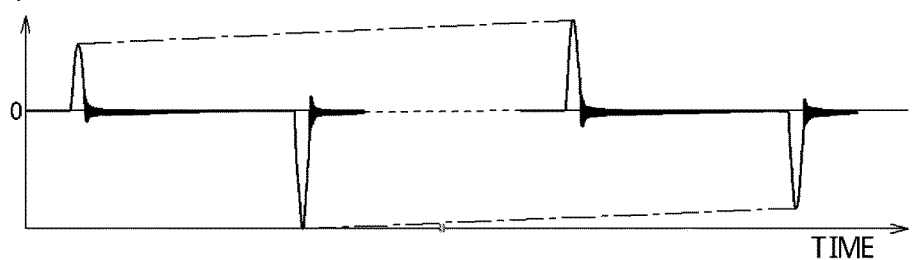
FIG. 11 is a waveform chart illustrating an example of variations in waveform of a current that flows through the resonance coil.

As discussed above, the voltage dividing circuit 6 sets an initial value of the bias potential Vb. In the case where the voltage dividing circuit 6 is provided, the potential of the resonance coil L1 on the reference potential Vref side can be set to the bias potential Vb immediately after power is turned on. In the case where the voltage dividing circuit 6 is not provided, as illustrated in FIG. 10, the potential of the resonance coil L1 on the reference potential Vref side is moved to an optimum value of the bias potential Vb by the action of the bias capacitor C1 after the gate drive circuit 1 starts operation. Similarly, the current which flows through the resonance coil L1 is unbalanced between the positive and negative directions immediately after the power source is turned on. Along with movement of the bias potential Vb, however, the current becomes balanced between the positive and negative directions. In the configuration illustrated in FIG. 9, the power source circuit PS is a symmetric power source in which "Vcc=|Vee|" is met or an asymmetric power source in which the difference between "Vcc" and "|Vee|" is relatively small, and may be a particularly effective circuit in the case where the accuracy of the power source voltage is high.

As described above, the gate drive circuit 1 (switching element drive circuit) drives the main switching element TR by providing the gate terminal (control terminal) of the main switching element TR with the drive signal SP, the source terminal or the emitter terminal of the main switching element serves as a ground terminal, and the reference potential Vref is connected to the ground terminal. The gate drive circuit 1 is configured to relieve a power loss of the gate drive circuit 1 due to the parasitic capacitance PC of the gate terminal of the main switching element TR, and to reduce a deviation in load balance in the circuit. Specifically, the gate drive circuit 1 includes the resonance coil L1 (inductor), the first current path 41, and the second current path 42. One terminal of the resonance coil L1 (inductor) is connected to the gate terminal side, and the other terminal of the resonance coil L1 is connected to the reference potential Vref side. The first current path 41 is constituted by connecting the first rectification circuit D1, the forward direction of which is the direction from the gate terminal side to the reference potential Vref side, and the first switch S1 in series with each other. The second current path 42 is constituted by connecting the second rectification circuit D2, the forward direction of which is the direction from the reference potential Vref side to the gate terminal side, and the second switch S2 in series with each other. The "reference potential Vref side" is met also in the case where the destination of connection of the circuit is changed from the "reference potential Vref" to the "bias potential Vb". The bias potential Vb is used to set an offset from a targeted potential. The bias potential Vb is used to set an offset from the reference potential Vref serving as the targeted potential. Thus, the "bias potential Vb side" is equivalent to the "reference potential Vref side".

In the gate drive circuit 1, the resonance control circuit 3 is constituted by connecting the rectification circuit 4, in which the first current path 41 and the second current path 42 are connected in parallel with each other, and the resonance coil L1 in series with each other. The resonance control circuit 3 is connected between the control terminal and the reference potential Vref such that the parasitic capacitance PC between the gate terminal and the ground terminal of the main switching element and the resonance control circuit 3 constitute a resonance circuit. The gate drive circuit 1 further includes the bias circuit 5 which sets a potential of a terminal of the resonance control circuit 3 on the opposite side from the gate terminal side to the bias potential Vb which is different from the reference potential Vref. One of the first switch S1 and the second switch S2 is exclusively brought into the on state so that one of the first current path 41 and the second current path 42 exclusively allows passage of a current. The first switch S1 and the second switch S2 are switched in accordance with the timing when the signal level of the drive signal SP transitions, which causes resonance between the resonance coil L1 and the parasitic capacitance PC.

Other Embodiments

Other embodiments of the switching element drive circuit (gate drive circuit (1)) will be described below. The configuration of each embodiment described below is not limited to its independent application, and may be applied in combination with the configuration of other embodiments unless any contradiction occurs.

Figure 12:
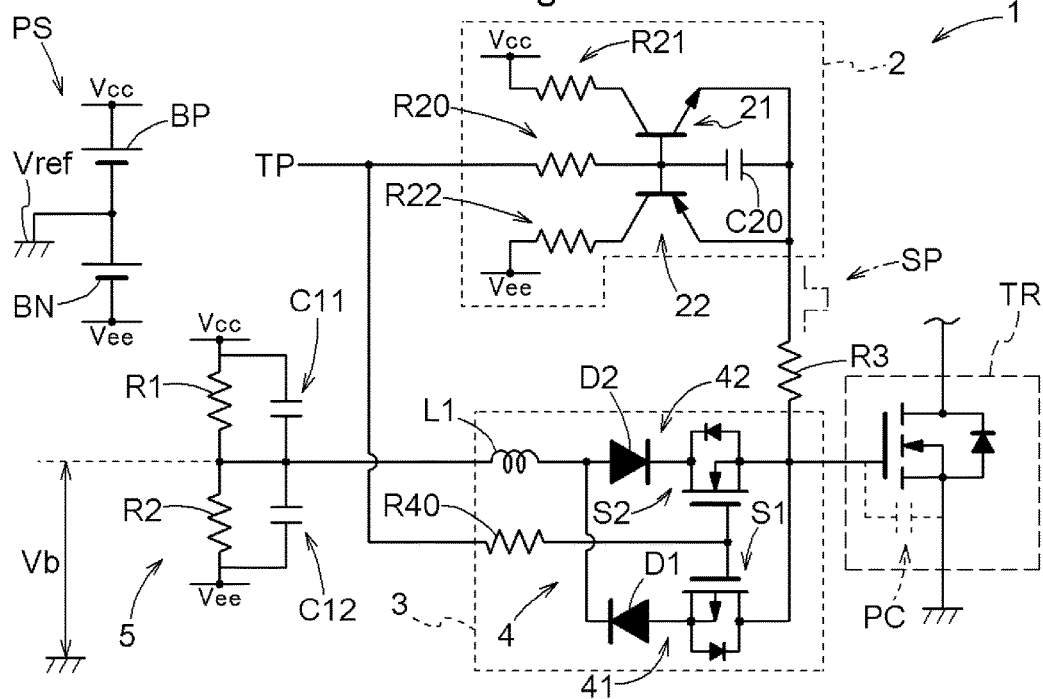
FIG. 12 is a schematic circuit diagram illustrating a different example of the configuration of the gate drive circuit.

(1) The gate drive circuit 1 is not limited to the aspect discussed above, and may be implemented in a variety of modifications. FIG. 12 illustrates still another example of the configuration of the gate drive circuit 1. As illustrated in FIG. 12, the bias circuit 5 may be constituted by connecting in series parallel circuits each including a resistor and a capacitor between the positive potential Vcc and the negative potential Vee. Specifically, the bias circuit 5 may be constituted by a series circuit of a parallel circuit of the resistor R1 and a capacitor C11 and a parallel circuit of the resistor R2 and a capacitor C12.

Figure 13:
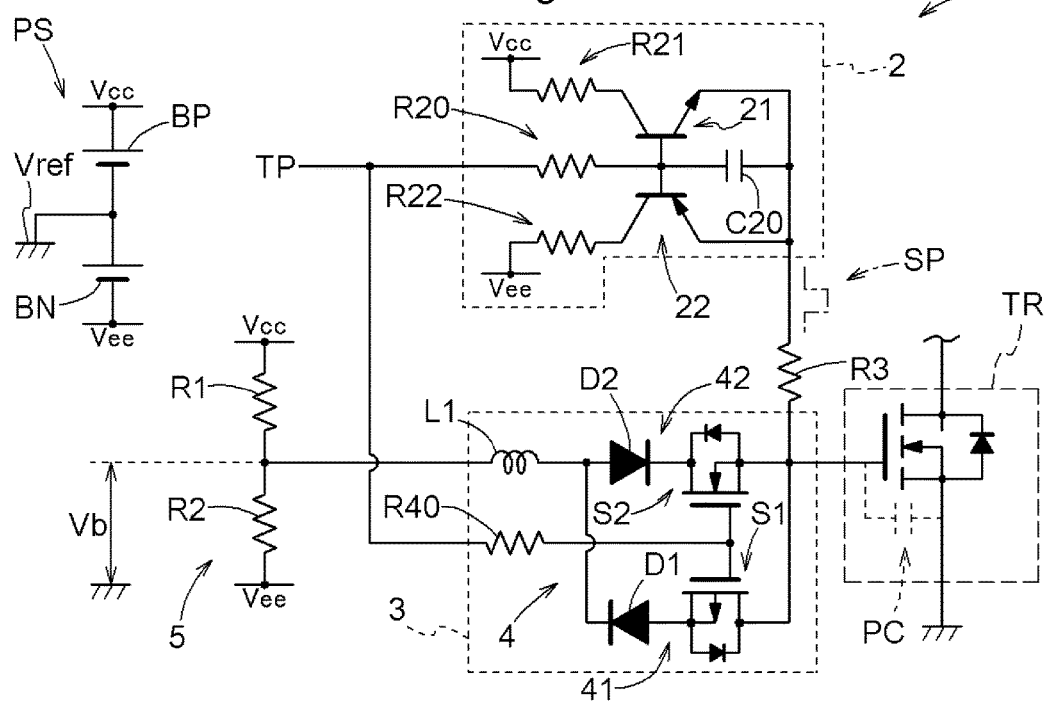
FIG. 13 is a schematic circuit diagram illustrating a different example of the configuration of the gate drive circuit.

(2) In addition, the gate drive circuit 1 may be configured as illustrated in FIG. 13. That is, the bias circuit 5 may be constituted of only the voltage dividing circuit 6 which is constituted of resistors. As discussed above, the voltage dividing circuit 6 which is constituted of resistors may not be able to set an accurate bias potential Vb. If it is possible to provide a bias with a value that is as close as possible to the bias potential Vb which is ideal, however, imbalance in current that flows through the resonance coil L1 can be corrected. The asymmetry of the drive signal SP can also be relieved.

Figure 14:
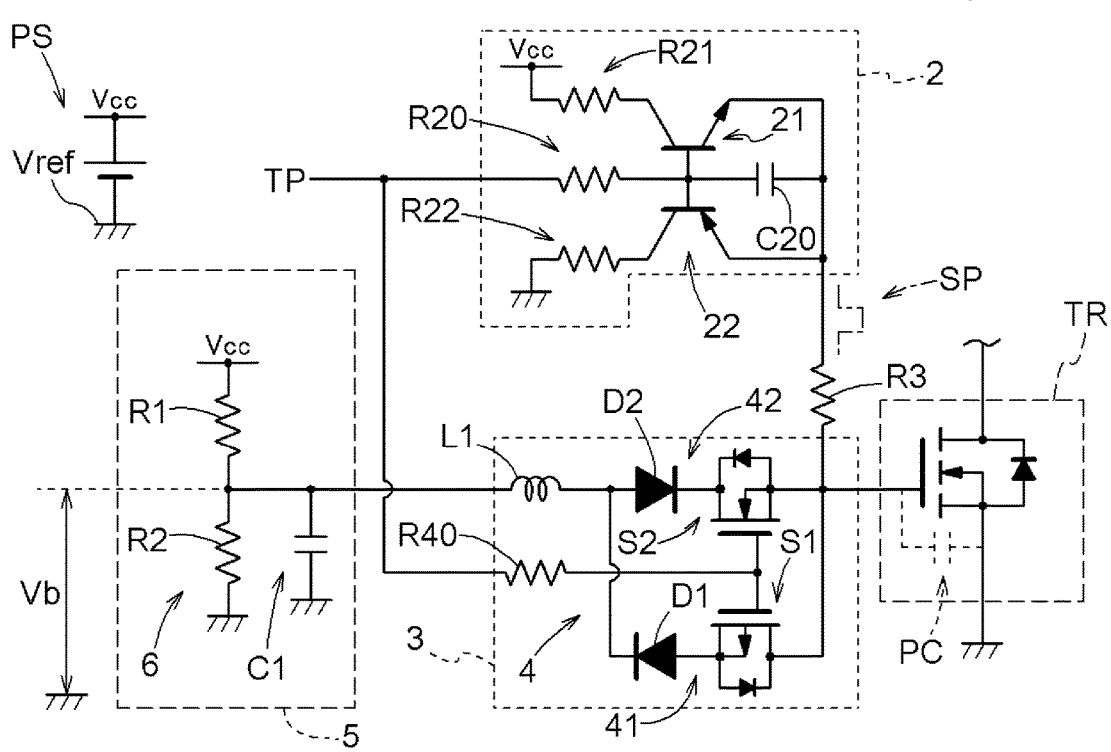
FIG. 14 is a schematic circuit diagram illustrating a different example of the configuration of the gate drive circuit.

(3) In the example described above, the drive signal SP is a bipolar signal that has a potential in both the positive and negative directions with respect to the reference potential Vref, and the power source circuit PS which is a bipolar power source is configured to generate the drive signal SP which is a bipolar signal. Even if the drive signal SP is a unipolar signal that has a potential in one of the positive and negative directions with respect to the reference potential Vref and the power source circuit PS is a unipolar power source, however, the parasitic capacitance PC at the gate terminal of the main switching element TR may affect the drive signal SP. Thus, the gate drive circuit 1 is preferably configured to have the bias circuit 5 such as that discussed above even if the drive signal SP is a unipolar signal and the power source circuit PS is a unipolar power source. FIG. 14 illustrates an example of the configuration of the gate drive circuit 1 corresponding to FIG. 2.

(4) In the example described above, the bias potential Vb in the positive direction with respect to the reference potential Vref is provided. However, the bias potential Vb is not limited to being in the positive direction with respect to the reference potential Vref, but may be in the negative direction. The direction of the bias potential Vb with respect to the reference potential Vref is determined by the relationship between the difference between the reference potential Vref and the positive potential Vcc and the difference between the reference potential Vref and the negative potential Vee and the potential at which a charge charged into the parasitic capacitance PC and a charge discharged therefrom are balanced with each other.

Overview of Embodiment

The overview of the switching element drive circuit (1) described above by way of example will be briefly described below.

In one aspect, the switching element drive circuit (1) is a switching element drive circuit (1) that drives a main switching element (TR) by providing a control terminal of the main switching element (TR) with a drive signal (SP), the main switching element (TR) including a ground terminal, which is a source terminal or an emitter terminal and to which a reference potential (Vref) is connected, the switching element drive circuit (1) including:

an inductor (L1), one terminal of which is connected to a control terminal side and the other terminal of which is connected to a reference potential (Vref) side;

a first current path (41) in which a first rectification element (D1), a forward direction of which is a direction from the control terminal side to the reference potential (Vref) side, and a first switch (S1) are connected in series with each other; and a second current path (42) in which a second rectification element (D2), a forward direction of which is a direction from the reference potential (Vref) side to the control terminal side, and a second switch (S2) are connected in series with each other, in which:

a resonance control circuit (3) is constituted by connecting a rectification circuit (4), in which the first current path (41) and the second current path (42) are connected in parallel with each other, and the inductor (L1) in series with each other;

the resonance control circuit (3) is connected between the control terminal and the reference potential (Vref) such that a parasitic capacitance (PC) between the control terminal and the ground terminal of the main switching element (TR) and the resonance control circuit (3) constitute a resonance circuit; and the switching element drive circuit (1) further includes a bias circuit (5) that sets a potential of a terminal of the resonance control circuit (3) on the opposite side from the control terminal side to a bias potential (Vb) that is different from the reference potential (Vref).

The drive signal (SP) for the main switching element (TR) relieves a power loss due to the parasitic capacitance (PC) through energy exchange by the parallel resonance circuit which is constituted of the parasitic capacitance (PC) and the inductor (L1). The parallel resonance circuit is very effective in the case where the drive signal (SP) is a positive and negative bipolar signal that is symmetric with respect to the reference potential (Vref). In the case where the drive signal (SP) is an asymmetric positive and negative bipolar signal, a DC component due to the asymmetry of the amplitude of the drive signal (SP) with respect to the reference potential (Vref) affects the resonance circuit. With the configuration described above, however, the DC component can be canceled by the bias potential (Vb). As a result, it is possible to relieve a power loss for the drive circuit (1) which drives the main switching element (TR) using a positive and negative bipolar signal that has asymmetric positive and negative potentials with respect to the reference potential (Vref) as the drive signal (SP), and to reduce a deviation in load balance in the drive circuit (1).

Here, preferably, the bias potential (Vb) is set such that a ratio (|Vcc−Vb|:|Vb−Vee|) between an absolute value (|Vcc−Vb|) of a potential difference between the positive potential (Vcc) and the bias potential (Vb) and an absolute value (|Vb−Vee|) of a potential difference between the negative potential (Vee) and the bias potential (Vb) is closer to 1:1 than a ratio (|Vcc|:|Vee|) between an absolute value (|Vcc|) of the positive potential (Vcc) and an absolute value (|Vee|) of the negative potential (Vee). The bias potential (Vb) corresponds to the electrical midpoint between the positive potential (Vcc) and the negative potential (Vee) as seen from the resonance circuit. Thus, when the ratio between the absolute value of the positive potential (Vcc) and the absolute value of the negative potential (Vee) with reference to the bias potential (Vb) is close to 1:1, a DC component that affects the resonance circuit can be reduced.

Here, in one aspect, preferably, the bias circuit (5) includes a bias capacitor (C1) connected between a ground-terminal-side terminal of the resonance control circuit (3) and the reference potential. A DC component due to the asymmetry of the amplitude of the drive signal (SP) with respect to the reference potential (Vref) is absorbed by the bias capacitor (C1). The center of the amplitude of the drive signal (SP) is moved by an amount corresponding to the bias potential (Vb) with respect to the reference potential (Vref), and thus the DC component is canceled.

In one aspect, preferably, the bias circuit (5) includes a voltage dividing circuit (6) that generates the bias potential (Vb). With the voltage dividing circuit (6), the bias potential (Vb) can be set immediately.

In one aspect, preferably, the bias potential (Vb) is a potential at which a charge in the parasitic capacitance (PC) which is varied along with variations in potential of the control terminal due to the drive signal (SP). By determining the bias potential (Vb) in this way, it is possible to appropriately set the bias potential (Vb) which matches the properties of the main switching element (TR), that is, the parasitic capacitance (PC).

The invention claimed is:

1. A switching element drive circuit that drives a main switching element by providing a control terminal of the main switching element with a drive signal that has asymmetric positive and negative potentials with respect to a reference potential, the main switching element including a ground terminal, which is a source terminal or an emitter terminal, and to which the reference potential is connected, the switching element drive circuit comprising:
   a power source circuit that is a positive and negative bipolar power source and includes a positive power source that provides a positive potential which is positive with respect to the reference potential and a negative power source that provides a negative potential which is negative with respect to the reference potential and whose absolute value is different from an absolute value of the positive potential, the positive and negative potentials being asymmetric with respect to the reference potential;
   an inductor, one terminal of which is connected to the control terminal and the other terminal of which is connected to the reference potential;
   a first current path in which a first rectification element, a forward direction of which is a direction from the control terminal to the reference potential, and a first switch are connected in series with each other; and
   a second current path in which a second rectification element, a forward direction of which is a direction from the reference potential to the control terminal, and a second switch are connected in series with each other, wherein:
   a resonance control circuit is formed by connecting a rectification circuit, in which the first current path and the second current path are connected in parallel with each other, and the inductor in series with each other;
   the resonance control circuit is connected between the control terminal and the reference potential such that a parasitic capacitance between the control terminal and the ground terminal of the main switching element and the resonance control circuit form a resonance circuit; and
   the switching element drive circuit further includes a bias circuit that sets a potential of a terminal of the resonance control circuit on a side of the resonance control circuit adjacent to the bias circuit to a bias potential that is different from the reference potential.

2. The switching element drive circuit according to claim 1, wherein
   the bias potential is set such that a ratio between an absolute value of a potential difference between the positive potential and the bias potential and an absolute value of a potential difference between the negative potential and the bias potential is closer to 1:1 than a ratio between an absolute value of the positive potential and an absolute value of the negative potential.

3. The switching element drive circuit according to claim 1, wherein
   the bias circuit includes a bias capacitor connected between a ground-terminal-side terminal of the resonance control circuit and the reference potential.

4. The switching element drive circuit according to claim 1, wherein
   the bias circuit includes a voltage dividing circuit that generates the bias potential.

5. The switching element drive circuit according to claim 1, wherein
   the bias potential is a potential at which a charge in the parasitic capacitance which is varied along with variations in potential of the control terminal due to the drive signal is balanced.

* * * * *